(12) United States Patent
Saunders et al.

(10) Patent No.: US 7,030,795 B1
(45) Date of Patent: Apr. 18, 2006

(54) DIGITAL AUTOMATIC GAIN CONTROL METHOD AND DEVICE

(75) Inventors: David R. Saunders, Scottsdale, AZ (US); Jeffrey D. Glaess, Queen Creek, AZ (US); Robert K. Hansen, Scottsdale, AZ (US); Arthur P. Helwig, Mesa, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 11/130,704

(22) Filed: May 17, 2005

(51) Int. Cl.
*H03M 1/06* (2006.01)
*H03M 1/62* (2006.01)
*H03M 1/84* (2006.01)
*H03M 1/88* (2006.01)

(52) U.S. Cl. ............... 341/139; 341/119; 455/234.1
(58) Field of Classification Search ........... 341/139, 341/132, 155, 156, 122, 119; 375/222; 455/234.1, 455/340; 332/103; 348/726; 360/46, 64
See application file for complete search history.

(56) References Cited

U.S. PATENT DOCUMENTS

| | | | | |
|---|---|---|---|---|
| 4,578,667 A | * | 3/1986 | Hollister | 341/122 |
| 4,827,191 A | * | 5/1989 | Chapman | 341/132 |
| 5,194,865 A | * | 3/1993 | Mason et al. | 341/132 |
| 5,389,927 A | * | 2/1995 | Turney et al. | 341/139 |
| 5,861,831 A | * | 1/1999 | Murden et al. | 341/139 |
| 5,870,051 A | * | 2/1999 | Warburton et al. | 341/155 |
| 5,929,799 A | * | 7/1999 | Rothenberg | 341/156 |
| 6,005,640 A | * | 12/1999 | Strolle et al. | 348/726 |
| 6,014,065 A | * | 1/2000 | Nishikawa | 332/103 |
| 6,134,430 A | * | 10/2000 | Younis et al. | 455/340 |
| 6,169,638 B1 | * | 1/2001 | Morling | 360/46 |
| 6,252,536 B1 | * | 6/2001 | Johnson et al. | 341/155 |
| 6,282,042 B1 | * | 8/2001 | Hana et al. | 360/64 |
| 6,289,044 B1 | * | 9/2001 | Velez et al. | 375/222 |
| 6,864,817 B1 | * | 3/2005 | Salvi et al. | 341/139 |
| 6,968,166 B1 | * | 11/2005 | Yang | 455/234.1 |
| 2002/0163979 A1 | | 11/2002 | Takatz et al. | |
| 2004/0151264 A1 | | 8/2004 | Montojo et al. | |

* cited by examiner

*Primary Examiner*—Patrick Wamsley

(57) ABSTRACT

An automatic gain control device (110) includes a peak detector (202) configured to receive a current output of an ADC (108) and to compare it to a previous output to produce a peak value. The automatic gain control device (110) also includes an out-of-range indicator (204) configured to receive an out-of-range signal if an input to the ADC exceeds the dynamic range of the ADC. The out-of-range indicator (204) increases the peak value if the out-of-range indicator (204) receives the out-of range signal. An error detector (206) is coupled to the out-of-range indicator (204) and the peak detector (202) and produces an error level that is the difference of an output of the out-of-range indicator (204) and a pre-selected target value. The pre-selected target value is chosen to attenuate interference signals that exceed the dynamic range of the ADC (108) but minimizes the attenuation of communication signals. An integrator (208) is coupled to the error detector (206) and sums the error level with an integrator value to determine a new integrator value. A quantizer (210), coupled to the integrator (208), receives the new integrator value and determines a new level of attenuation.

20 Claims, 4 Drawing Sheets

DIGITAL AUTOMATIC GAIN CONTROL METHOD AND DEVICE

TECHNICAL FIELD OF THE INVENTION

This invention relates to the field of communications and, more particularly, to a digital wideband automatic gain control method and device.

BACKGROUND OF THE INVENTION

Digitally coded communication signals are used in certain wireless communication systems. One such system is a Code Division Multiple Access (CDMA) cellular system. In a typical CDMA system, digitally coded communication systems signals are transmitted in a common channel between a mobile station and a base station. In a typical CDMA system, multiple communication channels of a fixed bandwidth are used to handle communications with mobile units.

In order for a base station to support the reception of multiple communication channels, a separate receiver is provided for each of the communication channels. In a typical embodiment, each receiver includes a filter to isolate the channel of interest. However, providing a receiver for each communication channel increases the size and cost of base stations.

Additionally, signals received by base station are subject to interference from a variety of sources. In order to ensure proper reception of communication signals, base stations must be able to handle the interference while receiving the communication signals. In the CDMA standards for base stations, a base station needs to be able to process communication channels that are subject to one or two interferers. The interferers are signals of high signal strength located near a communication channel. In a typical CDMA system utilizing separate receivers for each communication channel, this requirement is easily satisfied by filtering out the interfering signals. One drawback of current systems is that base stations must have a receiver for each communication channel supported by the base station. This increases both the size of the base station and the cost to deploy the base station.

To decrease the size and cost of base stations, wideband receivers have been proposed that can receive and process several common channels. These receivers typically utilize an analog-to-digital converter (ADC) to convert the received analog signal to a series of digital values, before separating the signal into individual channels for further processing. However, because the interferers are not filtered out before processing in the ADC, the incoming signal may be of such strength that the maximum capability of the ADC is exceeded and the ADC becomes saturated, which results in the inability to reflect further increases in incoming signal strength as increases in the ADC output. In order to ensure the ADC is not saturated, the incoming signal should be attenuated. Therefore, what is needed is a digital wideband automatic gain control method and device.

BRIEF DESCRIPTION OF THE DRAWINGS

The present invention will hereinafter be described in conjunction with the following drawing figures, wherein like numerals denote like elements, and.

DETAILED DESCRIPTION OF THE DRAWINGS

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

While the present invention is discussed in a telecommunication environment, the present invention can be used in any application where the received signal for an ADC may need attenuation to avoid saturation of the ADC.

Figure 1:
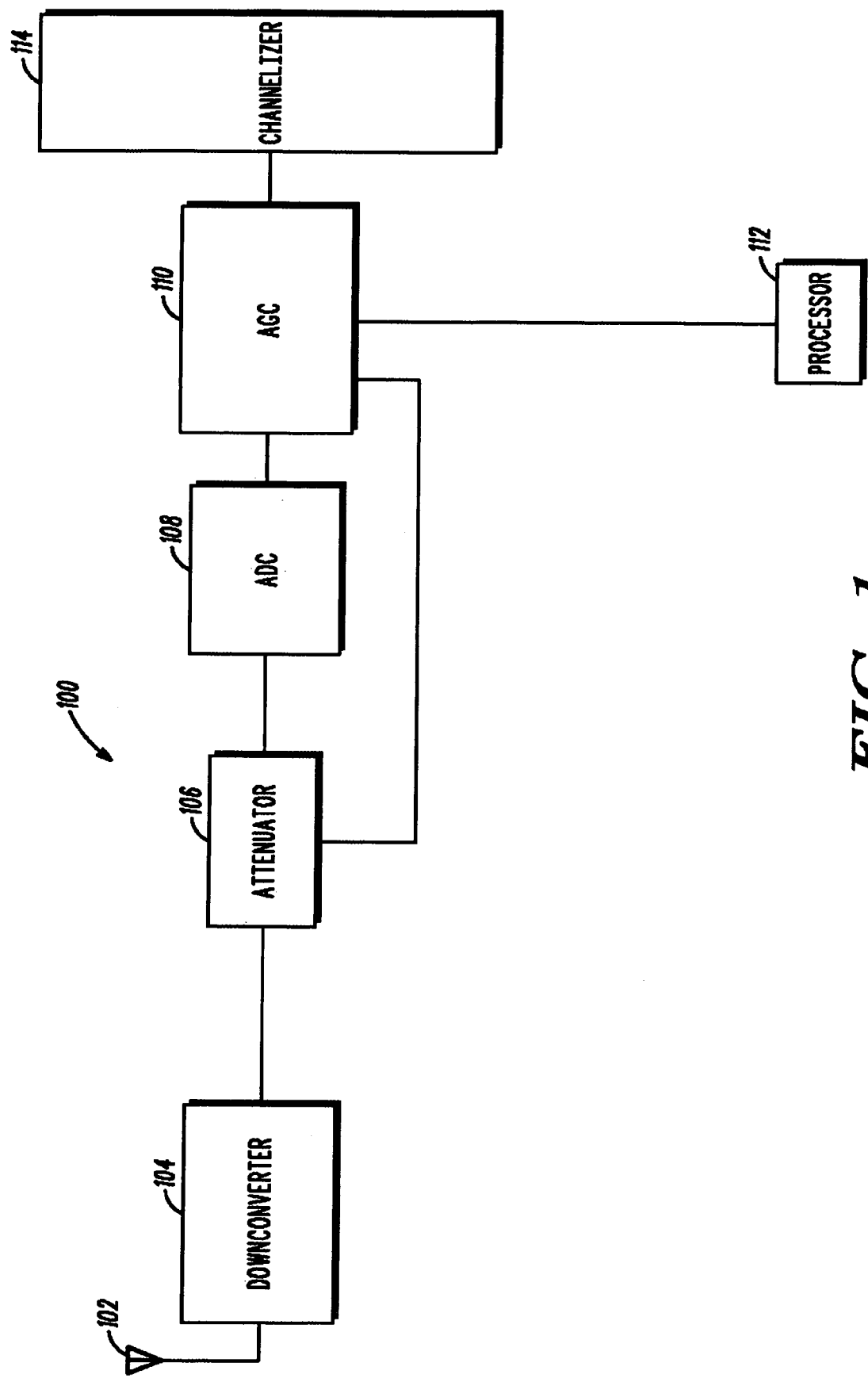
FIG. 1 is a block diagram of an exemplary receiver assembly.

FIG. 1 illustrates an exemplary receiver assembly 100. Exemplary receiver assembly 100, in one exemplary embodiment, receives a wideband signal comprising two or more wireless channels, downconverts the RF signal to an intermediate frequency for processing, converts the analog signals to digital signals and splits the signal into individual channels for further processing. Receiver assembly 100 comprises an antenna 102 coupled to a downconverter 104 which couples to an analog to digital converter (ADC) 108. An attenuator 106 is placed between the downconverter 104 and the ADC 108, and an automatic gain control device (AGC) 110 couples to the attenuator 106 and the output of the ADC 108. A processor 112 is coupled to the AGC 110. The output of the AGC 110 is coupled to a channelizer 114.

Figure 2:
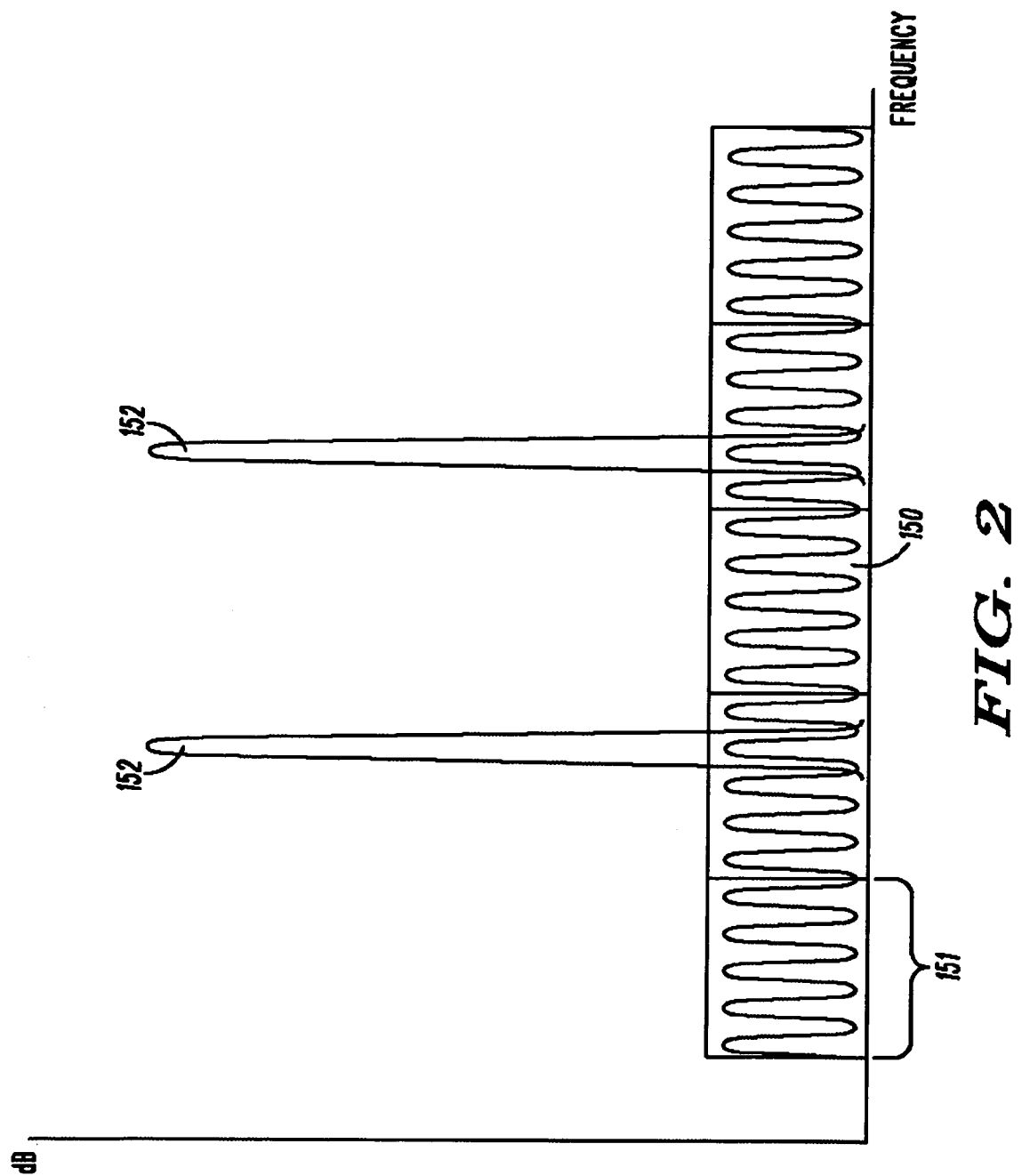
FIG. 2 is a graph of multiple communication channels and interferer signals.

In an exemplary embodiment, wideband communication signals comprising two or more common channels and any potential interference signals are received at antenna 102, which is of conventional design. As seen in FIG. 2, communication signals 150 from communication channel 151 can be received in the presence of strong interference signals 152. The received communication signals 150 are received from the antenna 102 by downconverter 104 for frequency downconverting, which is well known in the art.

The downconverted signal can be attenuated if necessary at attenuator 106. Attenuator 106 is controlled by the AGC 110 and reduces the strength of the incoming signal prior to digitizing by the ADC 108. The attenuation of the downconverted signal is needed to prevent saturation of the ADC 108. As seen in FIG. 2, it is the interference signals that can cause the saturation of the ADC 108. The digitized signal is split into individual channels by channelizer 114 and further processed as needed.

The ADC 108 converts the received analog signals to digital signals by, in a typical embodiment, sampling the analog signal at a set sampling rate and comparing each sample to a reference voltage to produce a digital representation of the sampled signal. Typically, this digital representation is in the form of a digital word. In an exemplary embodiment, ADC 108 can be a high speed ADC 108 with a large resolution to process voice and data without degrading quality. In one exemplary embodiment, ADC 108 is a 14 bit high speed, high performance ADC.

In a typical embodiment, the ADC 108 outputs a digital representation of a voltage level corresponding to the amplitude of the sampled analog signal. For example, if the analog signal sampled by ADC 108 has a range of −10 volts to 10 volts and the ADC has a resolution of 14 bits, the voltage resolution of the ADC is (10 volts−(−10 volts))/16,834 steps=1.22 mV/step. An incoming analog signal of 6 volts can then be converted to a number of steps as 6 volts/(1.22 mV/step)=4,918 steps. The number of steps can be converted to a binary word to get the output of the ADC.

Figure 3:
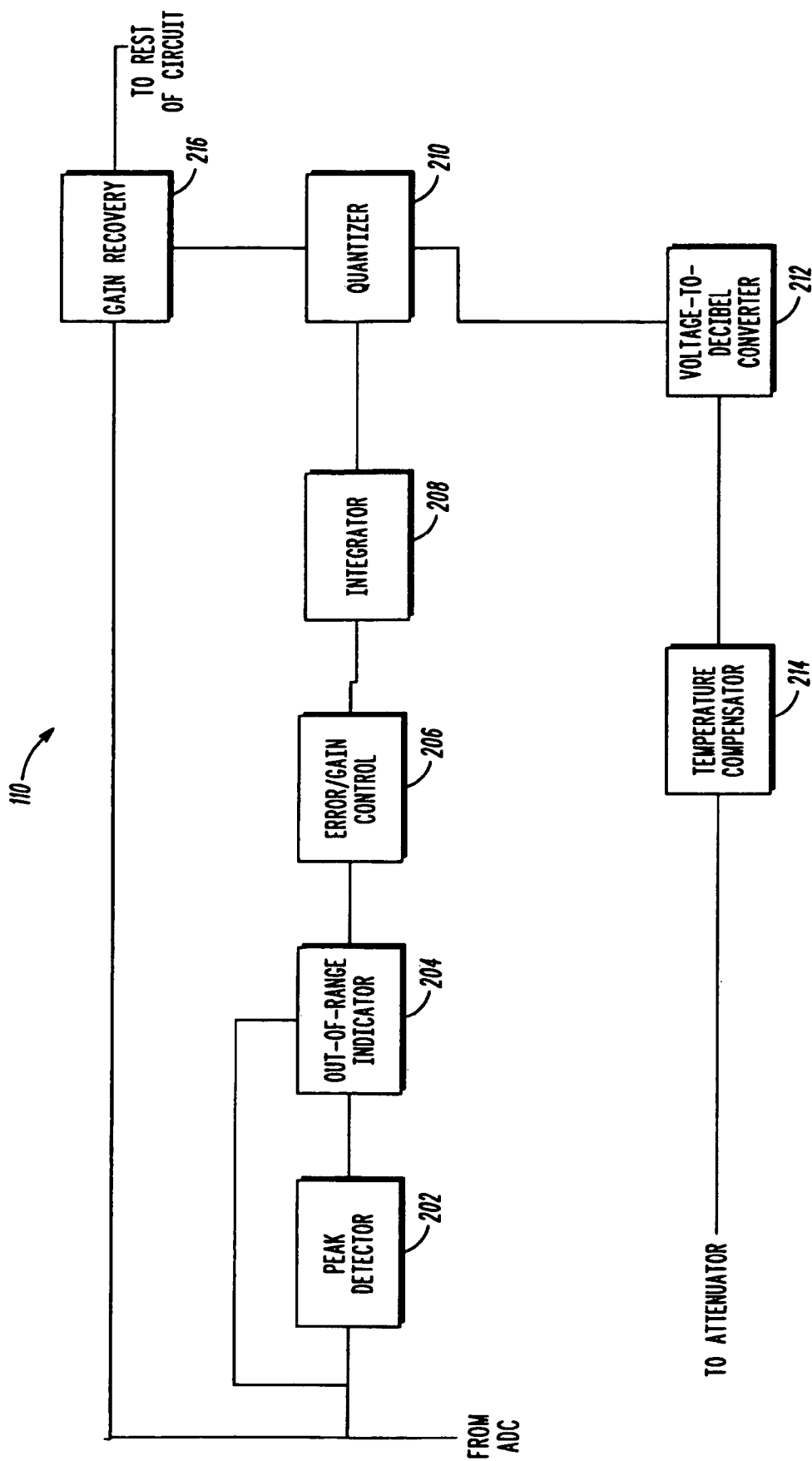
FIG. 3 is a block diagram of an exemplary embodiment of the automatic gain control device.

As discussed above, the AGC 110 controls the amount of attenuation provided by attenuator 106. The AGC 110 can be implemented using any combination of well known integrated circuits and digital logic devices. Also, the AGC 110 can be implemented as a program executed on a processor, such as a digital signal processor. AGC 110, in one exemplary embodiment, operates in a feedback loop by comparing the current output of the ADC 108 with a previous output of the ADC 108. FIG. 3 is a block diagram of an exemplary embodiment of the AGC 110. AGC 110 comprises a peak detector 202 coupled to an out-of-range indicator 204. An error detector/loop gain 206 couples to the out-of-range indicator 204 and an integrator 208. Integrator 208 couples to a quantizer 210 which couples to both a gain recovery/selector 216 and a volt-to-decibel converter 212. AGC 110 may also comprise a temperature compensator 214 coupled to the volt-to-decibel converter 212. The quantizer 210, integrator 208, error detector 206, volt-to-decibel converter 212 and temperature compensator 214 can couple to processor 112.

Peak detector 202 determines if the incoming digitized value from the ADC 108 is larger than a previously received value. In one exemplary embodiment, peak detector 202 first determines the absolute value of the current value outputted by the ADC 108 and compares the current absolute value to a previous absolute value to determine which one is larger. The previous value in one exemplary embodiment is the value immediately preceding the current value; however, the previous value can also be some other value received from the ADC at some other time. The larger of the current value and the previous value is selected. In one exemplary embodiment, the previous value can be decreased by some amount using a decay factor prior to comparison with the current level. This prevents the AGC 108 from continuously selecting the same value as a maximum value.

The output of the peak detector 202 is received at the out-of-range indicator 204, which also receives a signal indicating from the ADC 108 indicative of whether the dynamic range of the ADC 108 was exceeded. For example, assuming the ADC has a dynamic range of −10 volts to 10 volts, if the input of the ADC 108 exceeds +/−10 volts, an indication of out-of-range will be sent from the ADC 108 to the out-of-range indicator 204. The out-of-range indicator 204 outputs the same value received by the out-of-range indicator 204 from the peak detector 202 if the current ADC 108 output is not out of range. If the current ADC 108 output is out of range, the out-of-range indicator 204 will output a multiple of the value received by the out-of-range indicator 204 from the peak detector 202. For example, in one exemplary embodiment, the output of the peak detector 202 is doubled by the out-of-range indicator 204 if the dynamic range of the ADC 108 is exceeded. Increasing the output of the out-of-range indicator 204 creates a larger error at the error detector/loop gain 206 and, therefore, will result in a large attenuation. This will decrease the loop response time to attenuate to a signal that exceeds the dynamic range of the ADC 108.

At the error detector/loop gain 206, the output of the out-of-range detector 204 is compared to a preset target value to generate an error amount. The target value is typically a pre-selected value that can be provided by the processor 112 or an associated memory (not pictured). The target value can be based on the saturation limit of the ADC. Typically, the interference signals 152 are significantly stronger in terms of signal strength that the communication signals 150 in the communication channels 151. Therefore, the interference signals 152 need to be attenuated below a level that would saturate the ADC 108. However, if too much attenuation occurs, the communication signals 150 within the communication channel 151 can be overly attenuated, resulting in the degradation of the communication signals 150. By setting the target value near the saturation point of the ADC 108, interference signals 152 that could oversaturate the ADC are attenuate without overly attenuating the communication signals 150. The error amount can be increased or decreased by a gain amount. Changing the gain will change the loop response time to attenuate signals.

Integrator 208 receives the output of the error detector/loop gain 206 and generates an integrator value by summing the integrator's current value with the output of the error detector 208. In one exemplary embodiment, the integrator value is not allowed to drop below one to avoid negative attenuation (i.e.; attenuation that will increase the gain of the incoming signal) which would counteract any temperature compensation from temperature compensator 214. Also, in one exemplary embodiment, the integrator 208 is designed to not generate an integrator value exceeding the maximum attenuation that can be provided by attenuator 106. By limiting the integrator value, the amount of time required for the AGC 110 to recover from a maximum to a minimum attenuation is reduced.

Quantizer 210 converts the integrator value from integrator 208 to an associated attenuation level. This can be done using a lookup table provided, in one exemplary embodiment, by processor 112. Alternatively, a mathematical relationship between the integrator output and the measure of attenuation can be used. In one exemplary embodiment, the output of the quantizer 210 is a voltage level. The voltage level can be converted into a decibel equivalent using volt-to-decibel converter 212. The decibel value is then sent to the attenuator 106 to attenuate the signal received from the downconverter 104. In one exemplary embodiment, the quantizer 210 and the volt-to-decibel converter 212 can be combined as a single unit.

AGC 110, in one exemplary embodiment, also includes a gain recovery unit 216 that restores the gain removed by attenuator 106. This is done to facilitate further processing of the digital signal, such as calculating the strength of the received signal. In another embodiment, the amount of attenuation used on a signal can be stored in the processor and the gain of the original signal can be recovered using that information, if necessary.

Additionally, because the attenuation can vary with temperature, temperature compensator 214 can also add an attenuation factor to the attenuator 106 based on the temperature to which the receiver is subject. The amount of the attenuation can be determined using processor 112 and a thermal sensor (not pictured).

Figure 4:
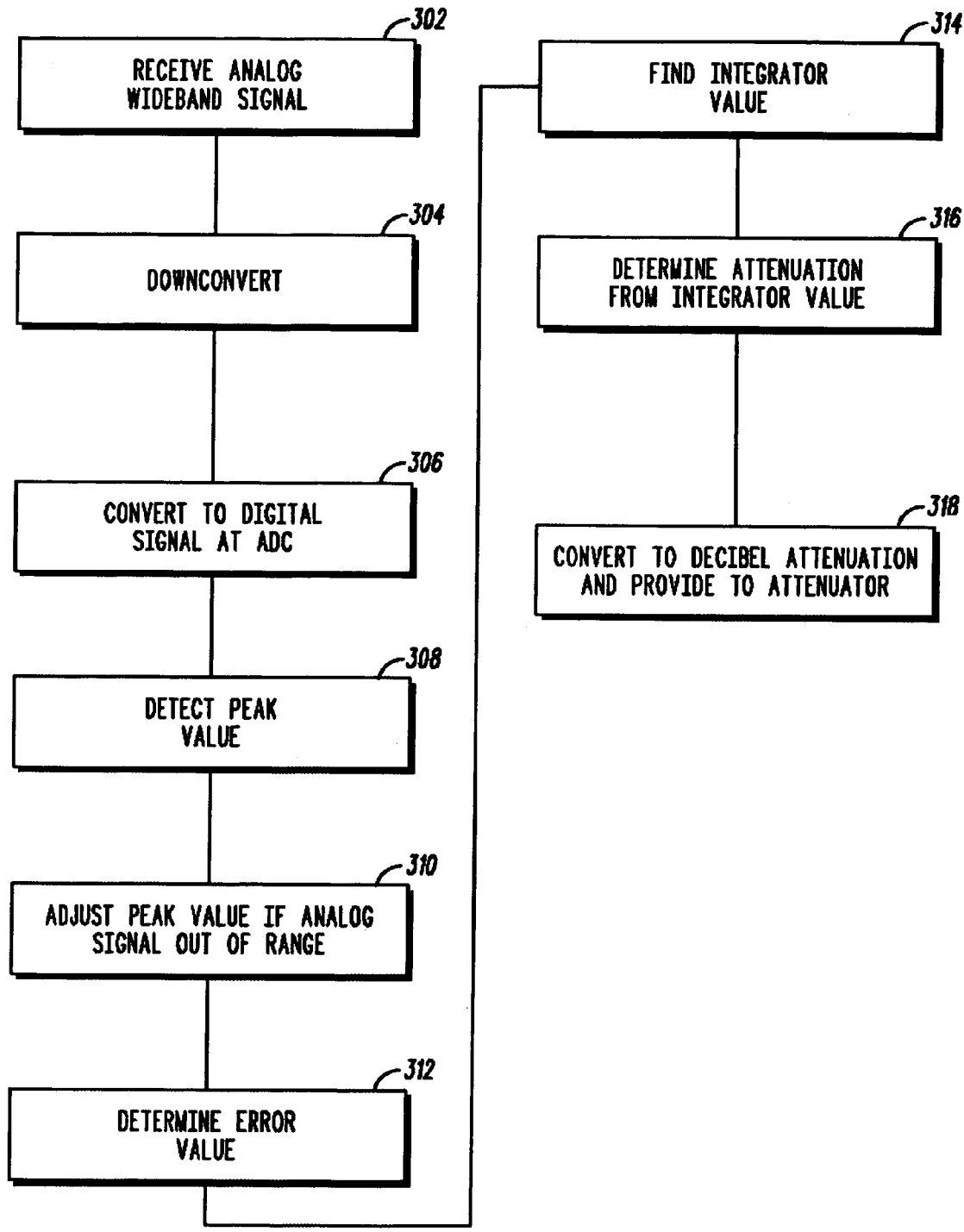
FIG. 4 is a flowchart illustrating an exemplary method for use of the present invention.

FIG. 4 is a flowchart illustrating an exemplary method for attenuating a wideband signal. In a first step, step 302, a wideband signal is received at antenna 102. The wideband signal, in one exemplary embodiment comprises two or more wireless communication channels 150. The signal is downconverted to an intermediate frequency using downconverter 104 in step 304. The downconverted signal is sampled and converted to digital values using ADC 108 in step 306.

As an example, assume that the dynamic range of the ADC 108 is ±2 volts, and that the ADC 108 is a four bit ADC. A four bit ADC has a resolution of 16 steps. In this example, the voltage resolution is (2 volts−(−2 volts))/16 steps=0.25 volts/step. Because both positive and negative numbers need to be represented by the output of the ADC 108, the well known two's complement method represented positive and negative integers in binary form. In the twos complement method, an integer is expressed as a N-bit binary word. The leftmost bit, also known as the most significant bit, is the sign bit. If it is 0 the following N−1 bits represents a positive number and if it is 1 the following N−1 bits represents a negative number. Before converting a binary word that represents a negative number to its it decimal equivalent, the binary word needs to be converted out of two's complement. One way is to invert all of the N−1 bits and add a binary 1. After that is done, the result can be converted back to a decimal equivalent. In the following example, the four bit number 0111 can be used to represent the maximum positive ADC output and 1000 the minimum negative level. Since that output can be doubled at the out-of-range indicator 204, another bit is needed. Also, since two's complement representation is being used, a leftmost bit is needed to represent the sign bit. Thus, a total of six bits will be needed to represent a binary word in this example; the five rightmost bits will represent the numerical value and the one leftmost bit is the sign bit.

Assuming, for this example, that the ADC input for the current sample is 2.1 volts, the ADC output is 000111, which represents the maximum binary output of the ADC in this example. Also, assuming for this example that the previous input to the ADC was 1.7 volts, the previous ADC output was (1.7 volts)/(0.25 volts/step)=6.8 steps. Converted to a digital word, the output of the ADC for the previous step is 000110. In step 308, the peak detector 202 receives the current ADC 108 output of 000111 and the previous output of 000110 and compares the two values. Typically, the previous output is decreased by a decay factor each time it is used in a comparison. The current output of 000111 exceeds the previous output of 000110. Therefore, the output of the peak detector 202 is 000111.

In step 310, since the current input value to the ADC 108 exceeds the dynamic range of the ADC 108, the out-of-range indicator 204 receives an out-of-range indication, resulting in the selection of a multiple of the peak detector 202 output. In this example the multiplication factor is two. Thus, the output of the out-of-range indicator 204 is 001110.

In step 312, an error value is generated that is equivalent to the difference between the out-of-range indicator 204 and a predetermined target value. In this case, the predetermined target value is assumed to be 000101. Thus, the error value is 001001, which is the output of the out-of-range indicator 204, 001110, less the predetermined target value, 000101. In this example, the gain at the error detector 208 is set to one.

Then, in step 314, the error value is received by the integrator, which sums the error value with a previous integrator value to determine a new integrator value. Assuming the previous integrator value was 000010, the new integrator value is 001001+000010, which is equal to 001011.

In step 316, the quantizer 210 receives the integrator value from the integrator 208 and converts the output to a digital measure of attenuation, such as, in one exemplary embodiment, a voltage level. The voltage level from the quantizer 210 is converted to a decibel value of attenuation by volt-to-decibel converter 212. For example, the new integrator value of 001011 may correspond to a voltage of 0.5 volts which corresponds to an attenuation level of 0.2 decibels.

Next, in step 318, the decibel value is received by the attenuator 106, which decreases the incoming signal by the attenuation amount. If desired, the gain removed by attenuator can be restored to the digitized signal to recover the full strength signal at gain recovery 216.

While the present invention has been discussed in the context of receiving wideband signals, the teaching of the present invention also is useful in attenuating interference that occurs within a communication channel. Interference signals that appear within the communication channels are difficult to filter out in present receivers because they appear within the passband of the present invention. In the present invention, the interference signal can be attenuated, the signal digitized and then processed.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed:

1. A method for attenuating a wideband analog signal before reception by an ADC:
   selecting as a peak value the larger of a current output of the ADC or a previous output of the ADC;
   determining an out-of-range indicator value, the out-of-range indicator value a multiple of the peak value if the current output exceeds an out of range value and the out-of-range indicator value the same as the peak value if the current output does not exceed an out-of-range value;
   determining an error signal, the error signal based on the difference between the out-of-range indicator value and a target value; and
   setting an attenuation level based on the error signal.

2. The method of claim 1 wherein the step of setting an attenuation level further comprises:
   determining a new integrator value by adding the error signal to an existing integrator value; and
   determining the attenuation level based on the new integrator value.

3. The method of claim 2 wherein the integrator value falls between one and a maximum upper range.

4. The method of claim 3 further comprising converting the new integrator value to a digital measure of attenuation and converting the digital level of attenuation to a decibel level.

5. The method of claim 1 wherein the step of selecting as a peak value further comprises reducing the previous output of the ADC by a decay factor.

6. The method of claim 1 wherein the step of determining an error signal further comprises setting the target value near the saturation point of the ADC.

7. The method of claim 1 further comprising increasing the error signal by a gain value after the step of determining an error signal.

8. The method of claim 1 further comprising adding the attenuation level to an output of the ADC.

9. The method of claim 1 further comprising determining a temperature based attenuation level.

10. An automatic gain control device comprising:
a peak detector configured to receive a current output of an ADC and compare it to a previous output to produce a peak value;
an out-of-range indicator configured to receive an out-of-range signal if an input to the ADC exceeds the dynamic range of the ADC, the out-of-range indicator operable to increase the peak value if the out-of-range indicator receives the out-of range signal;
an error detector coupled to the out-of-range indicator and the peak detector and operable to produce an error level, the error level the difference of an output of the out-of-range indicator and a pre-selected target value, the pre-selected target value chosen to attenuate interference signals that exceed the dynamic range of the ADC but minimize the attenuation of communication signals;
an integrator coupled to the error detector and configured to sum the error level with an integrator value to determine a new integrator value; and
a quantizer coupled to the integrator and operable to receive the new integrator value and determine a new level of attenuation.

11. The automatic gain control device of claim 10 further comprising a volt-to-decibel converter to convert the new level of attenuation to an amount of decibel attenuation.

12. The automatic gain control device of claim 10 further comprising a temperature attenuation compensator for determining an attenuation value based on the temperature of the automatic gain control.

13. The automatic gain control device of claim 10 further comprising a gain recovery unit operable to restore the output of the ADC to its original signal strength.

14. The automatic gain control device of claim 10 wherein the integrator has a minimum value of one to prevent any negative attenuation.

15. The automatic gain control device of claim 10 wherein the quantizer further comprises a lookup table relating the integrator output to an attenuation level.

16. The automatic gain control device of claim 10 wherein the previous output is decreased by a decay factor prior to each time the previous output is compared with the current output.

17. A receiver for receiving two or more communication channels in the presence of interference, the receiver comprising:

an antenna operable to receive an analog signal comprising two or more communication channels;
an analog to digital converter coupled to the antenna and configured to sample the analog signal and to convert the analog signal into a digital representation;
an attenuator coupled to the antenna and configured to attenuate the analog signal prior to the analog-to-digital converter sampling the analog signal; and,
an automatic gain control coupled to the output of the analog to digital converter and an input of the attenuator, the automatic gain control comprising:
a peak detector configured to receive a current output of an ADC and compare it to a previous output to produce a peak value;
an out-of-range indicator configured to receive an out-of-range signal if an input to the ADC exceeds the dynamic range of the ADC, the out-of-range indicator operable to increase the peak value if the out-of-range indicator receives the out-of range signal;
an error detector coupled to the out-of-range indicator and operable to produce an error level, the error level the difference of an output of the out-of-range indicator and a pre-selected target value chosen to attenuate interference signals that exceed the dynamic range of the ADC but minimize the attenuation of communication signals;
an integrator coupled to the error detector and configured to sum the error level with an integrator value to determine a new integrator value; and
a quantizer coupled to the integrator and operable to receive the new integrator value and determine a new level of attenuation.

18. The receiver of claim 17 further comprising a channelizer to separate the analog signal into the two or more communication channels.

19. The receiver of claim 17 further comprising a temperature attenuation compensator for determining an attenuation value based on the temperature of the automatic gain control.

20. The receiver of claim 17 further comprising a gain recovery unit operable to restore the output of the ADC to its original signal strength.

* * * * *